(12) United States Patent
Bao

(10) Patent No.: US 9,154,081 B2
(45) Date of Patent: Oct. 6, 2015

(54) SUBHARMONIC MIXER

(75) Inventor: Mingquan Bao, Västra Frölunda (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/362,394

(22) PCT Filed: Dec. 2, 2011

(86) PCT No.: PCT/EP2011/071614
§ 371 (c)(1),
(2), (4) Date: Jun. 2, 2014

(87) PCT Pub. No.: WO2013/079119
PCT Pub. Date: Jun. 6, 2013

(65) Prior Publication Data
US 2014/0349600 A1    Nov. 27, 2014

(51) Int. Cl.
| H04B 1/26 | (2006.01) |
| H03D 7/16 | (2006.01) |
| H03D 7/12 | (2006.01) |
| H03D 7/14 | (2006.01) |

(52) U.S. Cl.
CPC ............... *H03D 7/163* (2013.01); *H03D 7/12* (2013.01); *H03D 7/125* (2013.01); *H03D 7/1475* (2013.01); *H03D 7/1491* (2013.01); *H03D 2200/0023* (2013.01)

(58) Field of Classification Search
CPC .................................................... H03D 7/1491
USPC ........................................................ 455/319
See application file for complete search history.

(56) References Cited

U.S. PATENT DOCUMENTS

| 5,325,000 A | 6/1994 | Birkeland et al. |
| 6,370,372 B1 * | 4/2002 | Molnar et al. ................. 455/323 |
| 7,483,687 B2 * | 1/2009 | Carrez .......................... 455/318 |
| 7,962,114 B2 * | 6/2011 | Garcia et al. .................. 455/323 |
| 2004/0092245 A1 * | 5/2004 | Katz ............................. 455/326 |

(Continued)

FOREIGN PATENT DOCUMENTS

| EP | 0555689 A2 | 8/1993 |
| EP | 1855378 A1 | 11/2007 |
| WO | 2009120117 A1 | 10/2009 |

OTHER PUBLICATIONS

Kodkani et al. "A 24-GHz CMOS Passive Subharmonic Mixer/Downconverter for Zero-IF Applications" IEEE Transactions on Microwave Theory and Techniques, vol. 56(5):1247-1254, 2008.

(Continued)

*Primary Examiner* — Sanh Phu
(74) *Attorney, Agent, or Firm* — Rothwell, Figg, Ernst & Manbeck, P.C.

(57) ABSTRACT

A sub-harmonic mixer comprising a mixer circuit with input ports for RF and LO signals, and an output port for the product of the signals at the input ports, and an LO switching stage with input ports for an LO signal and the LO signal phase shifted 180 degrees. The LO switching stage comprises a third input port to which the output port of the mixer circuit is connected and a first output port for the product of the signal at its third and first input ports, and a second output port for the product of the signal at the third and second input ports with the same amplitude as the first output signal 180 degrees phase shifted. In the sub-harmonic mixer the mixer circuit comprises a transconductance mixer.

4 Claims, 7 Drawing Sheets

(56) References Cited

U.S. PATENT DOCUMENTS

2004/0121751 A1    6/2004  Shen
2007/0242779 A1*  10/2007  Choi et al. .................... 375/332
2008/0032659 A1*   2/2008  Chang et al. .................. 455/323

OTHER PUBLICATIONS

Wernehag et al. "A 30 GHz 90 nm CMOS Passive Subharmonic Mixer with 15 GHz Differential LO" IEEE, pp. 123-126, 2008.

* cited by examiner

SUBHARMONIC MIXER

CROSS REFERENCE TO RELATED APPLICATION(S)

This application is a 35 U.S.C. §371 National Phase Entry Application from PCT/EP2011/071614, filed Dec. 2, 2011, designating the United States, the disclosure of which is incorporated herein in its entirety by reference.

TECHNICAL FIELD

The present invention discloses an improved subharmonic mixer.

BACKGROUND

In systems for the receiving and/or transmitting electromagnetic signals, such as, for example, radio, TV or radar systems, conversion of the electromagnetic signal's frequency is a common occurrence, for which so called mixers are used.

In such systems, mixers are used in order to shift from a radio frequency, RF, to a lower frequency, usually a so called intermediate frequency, IF, signal. Naturally, a mixer can also be used in order to shift in the other direction, i.e. from an IF signal to an RF signal, so called "up-conversion", as opposed to "down-conversion".

In the case where a mixer is used for shifting from an RF signal to an IF signal, the mixer is provided with two input signals, the RF signal and a local oscillator, LO, signal, and the mixer produces the IF signal as its output signal. The frequency of the IF signal, i.e. the IF frequency, $f_{IF}$, is determined by the RF frequency, $f_{RF}$, and the LO frequency, $f_{LO}$, as described by the equation $f_{IF}=f_{RF}-f_{LO}$. As those skilled in the field will know, a "sum frequency" $f_{RF}+f_{LO}$ is also obtained in the mixer, but this frequency is usually not used.

A subharmonic mixer is a special kind of mixer, which operates using the equation $f_{IF}=f_{RF}-2f_{LO}$. Since the LO frequency here is multiplied by two, a lower LO frequency can be used than in mixers which employ the LO signal "multiplied by one", as in the equation $f_{IF}=f_{RF}-f_{LO}$. The use of a lower LO frequency is often beneficial in that it gives the subharmonic mixer lower phase noise and higher output power than with the use of a higher LO frequency, which is used in mixers which use the equation $f_{IF}=f_{RF}-f_{LO}$.

Key parameters in a sub-harmonic mixer are the conversion gain and linearity.

A subharmonic mixer's linearity is often measured by a so called two-tone test in which two RF signals with a small frequency separation between them are input to the subharmonic mixer and the intermodulation components at the output of the subharmonic mixer are measured. The amplitudes' intensities of the second-order and third-order intermodulation components are indicative of the mixer's linearity.

Known kinds of subharmonic mixers include Gilbert-type subharmonic mixers and passive subharmonic mixers. Gilbert-type subharmonic mixers exhibit poor linearity, while passive subharmonic mixers exhibit poor conversion gain.

SUMMARY

It is an object of the invention to obtain a subharmonic mixer which has improved characteristics with respect to linearity and conversion gain as compared to previous such mixers.

This object is obtained by means of a subharmonic mixer which comprises a mixer circuit with an input port for an RF signal and an input port for an LO signal. The mixer circuit also comprises an output port at which the mixer circuit is arranged to output a signal which is the product of the signals at the mixer circuit's input ports. The subharmonic mixer further comprises an LO switching stage with a first input port for an LO signal and a second input port for the LO signal phase shifted 180 degrees with respect to its phase at the first input port. The LO switching stage further comprises a third input port to which the output port of the mixer circuit is connected, and the LO switching stage also comprises a first output port at which the LO switching stage is arranged to output a first output signal which is the product of the signal at its third and first input ports, and a second output port at which the LO switching stage is arranged to output a second output signal which is the product of the signal at its third and second input port, and which has the same amplitude as the first output signal but with a 180 phase difference. In the subharmonic mixer, the mixer circuit comprises a transconductance mixer.

By means of this subharmonic mixer, as will be shown in the following detailed description, improved linearity and conversion gain are obtained.

In embodiments, the sub-harmonic mixer comprises a power splitter for splitting an LO signal into first and second LO signals, where the first LO signal is connected to the input port for an LO signal of the transconductance mixer and the second LO signal is used to produce the LO signals for the first and second input ports of the LO switching stage.

In embodiments, the sub-harmonic mixer comprises a first balun which is used with the second LO signal in order to produce the LO signals for the first and second input ports of the LO switching stage.

In embodiments of the sub-harmonic mixer, the LO switching stage comprises an emitter/source coupled pair of bipolar/FET transistors, with the emitter/source coupling used as the third input port of the LO switching stage, and the bases/gates of the transistors as the first and second input ports and the collectors/drains as the first and second output ports.

In embodiments of the sub-harmonic mixer, the transconductance mixer comprises a power combiner with two input ports and one output port, with one of the two input ports used as the input port for an RF signal and the other as the input port for an LO signal. The output port is connected to the base/gate of a bipolar/FET transistor which is also comprised in the transconductance mixer, and the collector/drain of the bipolar/FET transistor is used as the output port of the transconductance mixer. The emitter/source of bipolar/FET transistor is grounded.

In embodiments of the sub-harmonic mixer, the transconductance mixer comprises a power combiner with two input ports and one output port, with one of the two input ports used as the input port for an RF signal and the other as the input port for an LO signal. In such embodiments, the sub-harmonic mixer also comprises a second balun with an unbalanced port and first and second balanced ports, and the transconductance mixer further comprises a first and a second bipolar/FET transistor, with one of the balun's balanced ports connected to the base/gate of the first bipolar/FET transistor and the other of the balun's balanced ports connected to the base/gate of the second bipolar/FET transistor. The collectors/drains of the bipolar/FET transistors are connected to each other and are used as the output port of the sub-harmonic mixer.

BRIEF DESCRIPTION OF THE DRAWINGS

The invention will be described in more detail in the following, with reference to the appended drawings, in which.

DETAILED DESCRIPTION

Figure 1:
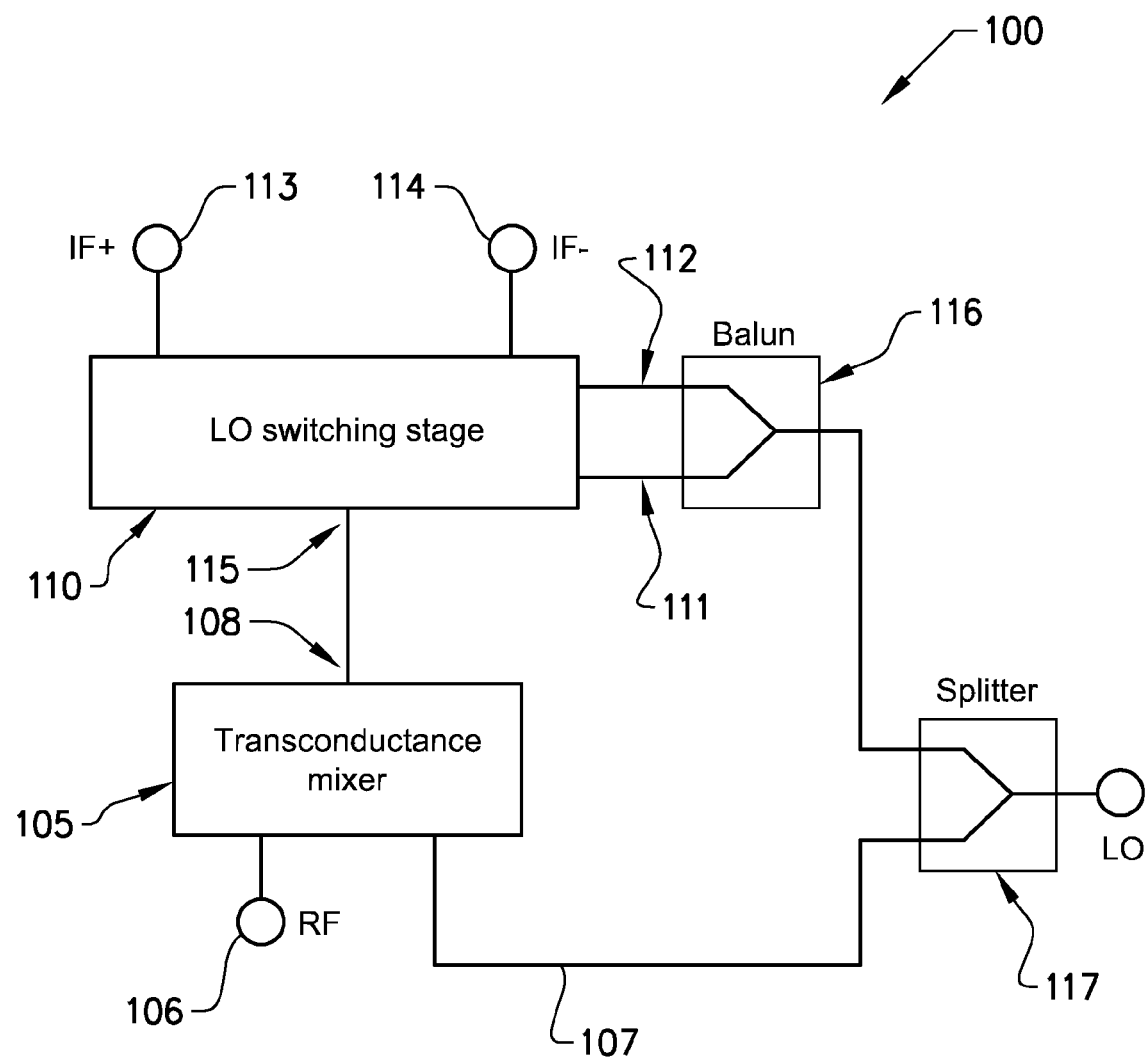
FIG. 1 shows a basic block diagram of a subharmonic mixer.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

FIG. 1 shows a basic block diagram of a subharmonic mixer 100. As shown in FIG. 1, the subharmonic mixer 100 comprises a mixer circuit 105, which in this case is a transconductance mixer. The transconductance mixer 105 is connected to an LO switching stage 110. The transconductance mixer 105 comprises two input ports, one input port 106 for an RF signal, and one 107 for an LO signal. The transconductance mixer 105 also comprises an output port 108 at which the transconductance mixer is arranged to output the product of the two input signals, so that the output signal at the output port 108 is RF*LO.

The LO switching stage 110 comprises three input ports, as follows: one input port 115 is used as input port for the output signal from the mixer circuit 105, i.e. the output port 108 of the mixer circuit 105 is connected to the input port 115 of the LO switching stage. In addition, the LO switching stage also comprises input ports 111 and 112, which are used for the input of the LO signal with a phase difference of 180 degree between them. In the particular embodiment shown in FIG. 1, a balun 116 is used for this purpose, i.e. to obtain two LO signals, with the same amplitude and a phase difference of 180 degree between them: the LO signal is connected to the "unbalanced" side of the balun 116, and at the "balanced" side the desired two signals LO are obtained. This manner of describing a balun will be used throughout this text: a balun has an unbalanced side and a balanced side, where there is one port at the unbalanced side and two ports at the balanced side. A signal which is input to the port on the unbalanced side may be accessed at both ports on the balanced side, with a phase shift of 180 degrees between the signal at the two ports on the balanced side, but with the same amplitude.

A similar principle is used in order to obtain an LO signal which can be used as input signal to the balun 116 and the mixer circuit 105: a power splitter (preferably with an equal split) 117 is used as input for an LO signal, and one of the output halves is used as the input LO signal to the mixer circuit 105 at input port 107, and the other half is used as input to the unbalanced side of the balun 116.

The LO switching stage 110 also comprises first 113 and second 114 output ports, also shown as IF+ and IF− in FIG. 1.

The LO switching stage 110 is arranged to output a first output signal at the first output port 113 which is the product of the signals at its third 115 and the first 111 input ports, i.e. (RF*LO)*(LO) and to output a second output signal at the second output port 114 which is the product of the signal at the third 115 and the second 112 input ports, i.e. (RF*L0)*(−L0), if (LO) and (−LO) is used to denote the two halves of the LO signals from the balun 116 with a 180 degree phase difference between them.

Figure 2:
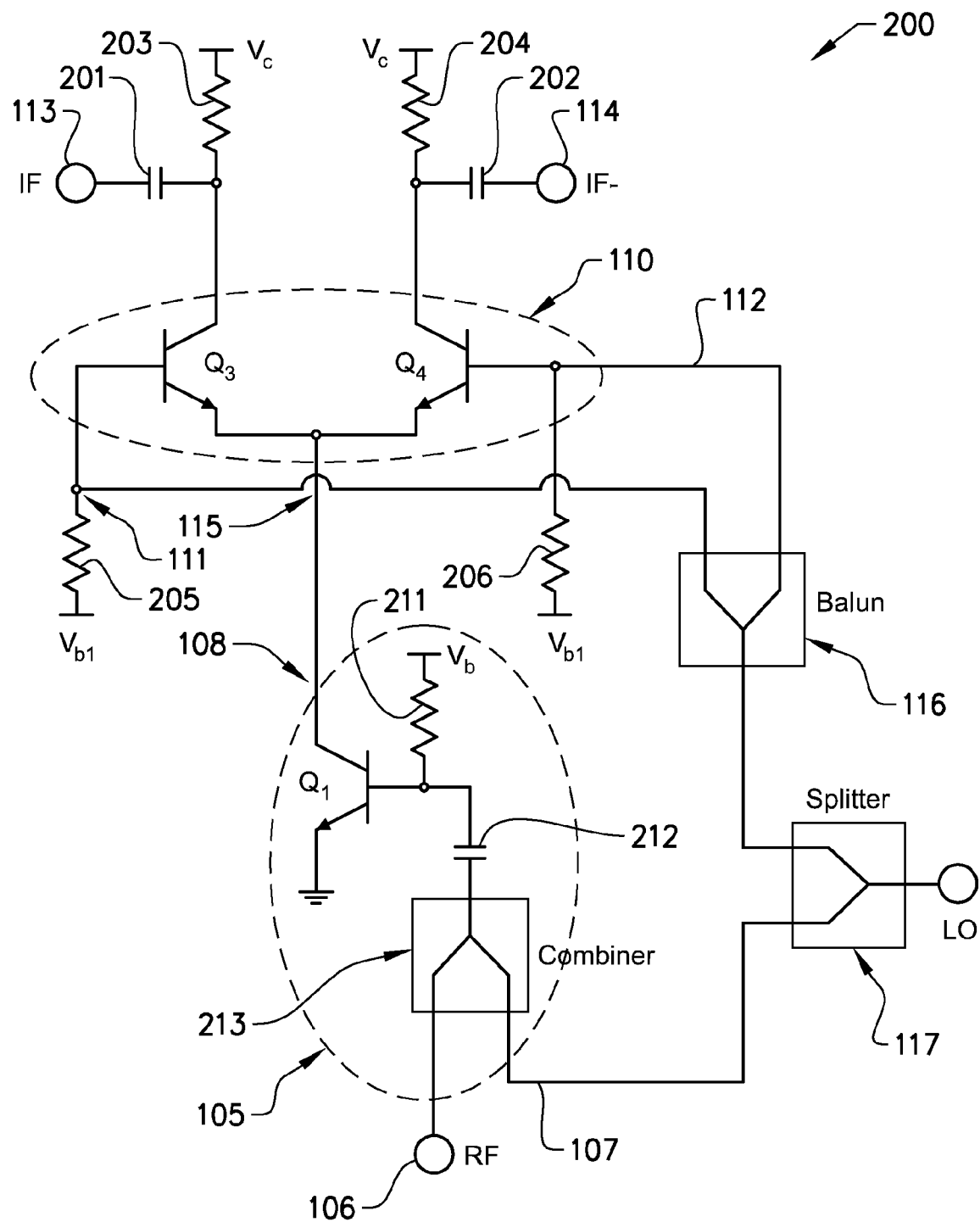
FIGS. 2-4 show embodiments of a subharmonic mixer.

FIG. 2 shows a second, more detailed embodiment 200 of a subharmonic mixer: in this embodiment, the LO switching stage mixer 110 comprises two emitter-coupled bipolar junction transistors $Q_3$ and $Q_4$, with the coupled emitters being used as the third input port 115 of the LO switching stage 110. The base of each transistor $Q_3$ and $Q_4$ is used as the first and second input ports 111, 112. The collector of each transistor $Q_3$ and $Q_4$ is used as an output port in order to obtain the two output ports 113 (IF), 114 (IF−), suitably via a capacitor 201, 202 at each collector, the two capacitors suitably being of equal capacitance. In addition, the collector of each of the two transistors is also used to apply a bias voltage $V_c$, suitably via respective (suitably equally sized) resistors 203, 204. In addition, a bias voltage $V_{b1}$ is suitably applied at each of the bases of the transistors $Q_3$, $Q_4$, via respective (suitably equally sized) resistors 205, 206.

The mixer circuit 105, i.e. the transconductance mixer, comprises a bipolar junction transistor $Q_1$ with the emitter grounded and with the collector used as the mixer circuit's output port 108, i.e. it is coupled to the input port 115 of the LO switching stage 110. A bias voltage $V_b$ is suitably applied to the base of the transistor $Q_1$ through a resistor 211. The two input ports 106, 107, of the mixer circuit 105 are obtained by means of connecting a power combiner 213 to the gate of the transistor $Q_1$, so that the combination of the input signals at the combiner's inputs 106 (the RF signal), 107 (the LO signal) is applied at the base of the transistor $Q_1$, suitably via a capacitor 212.

Figure 3:
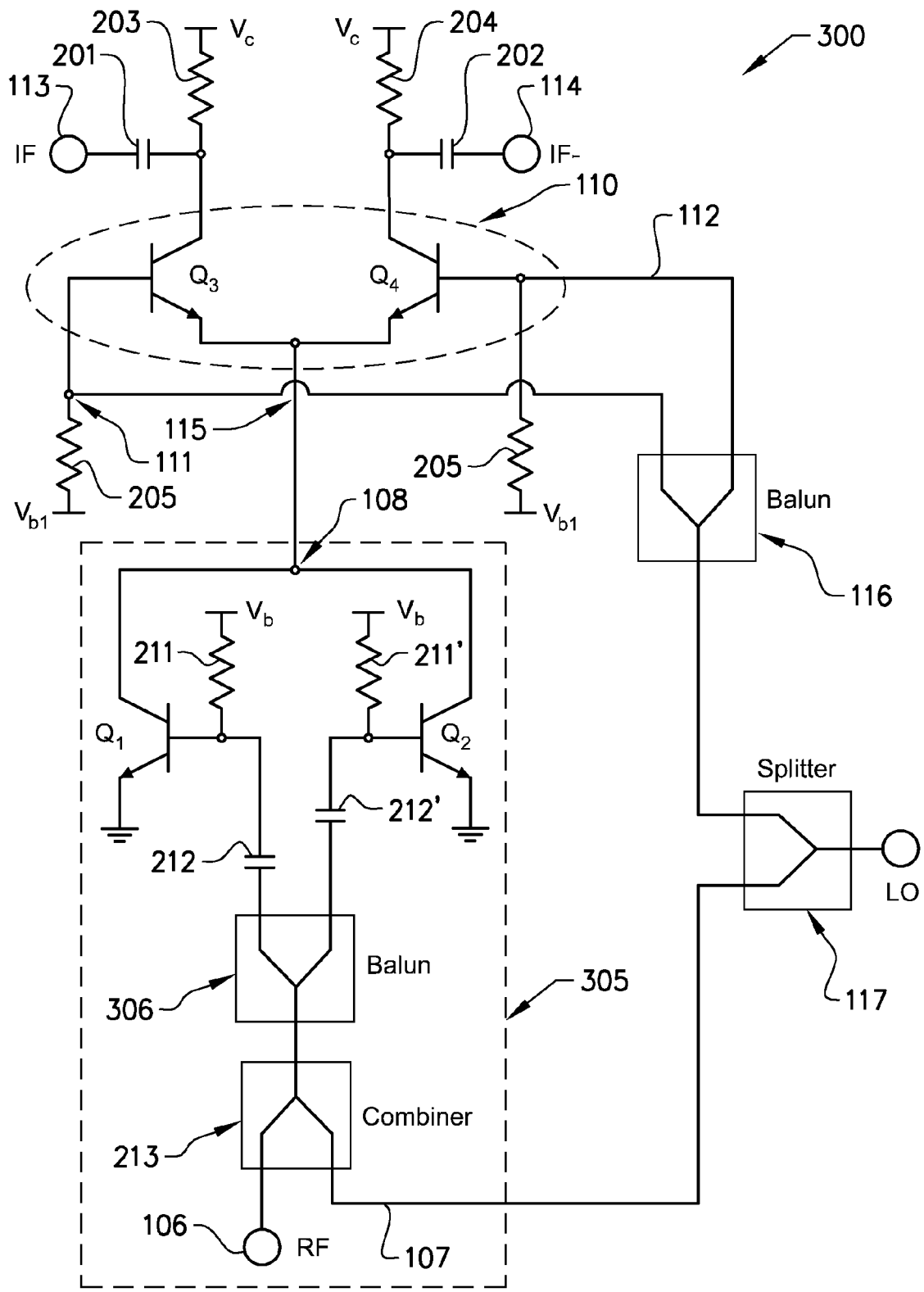

FIG. 3 shows a further embodiment 300 of a sub-harmonic mixer. A difference between the embodiments 200 and 300 is in the transconductance mixer 305, which is the part of the embodiment 300 and which will be described in detail here. As opposed to the transconductance mixer of the embodiment 200, the transconductance mixer 305 of the embodiment 300 comprises a first $Q_1$ and a second $Q_2$ bipolar junction transistor which are collector-coupled and which have their emitters grounded.

The coupled collectors of the transistors $Q_1$ and $Q_2$ is used as the output port 108 of the transconductance mixer 305, i.e. it is connected to the input port 115 of the LO switching stage 110. In order to obtain input signals for both transistors $Q_1$ and $Q_2$, the transconductance mixer 305 also comprises a balun 306, the "unbalanced" side of which is connected to the output port of the power combiner 213, and one each of the "balanced" output signals is connected to the base of one of the transistors $Q_1$ and $Q_2$, suitably via equally sized capacitors 212, 212'. The bases of Q1 and Q2 are used to apply a bias voltage $V_b$, suitably by means of equally sized capacitors 211, 211'.

Figure 4:
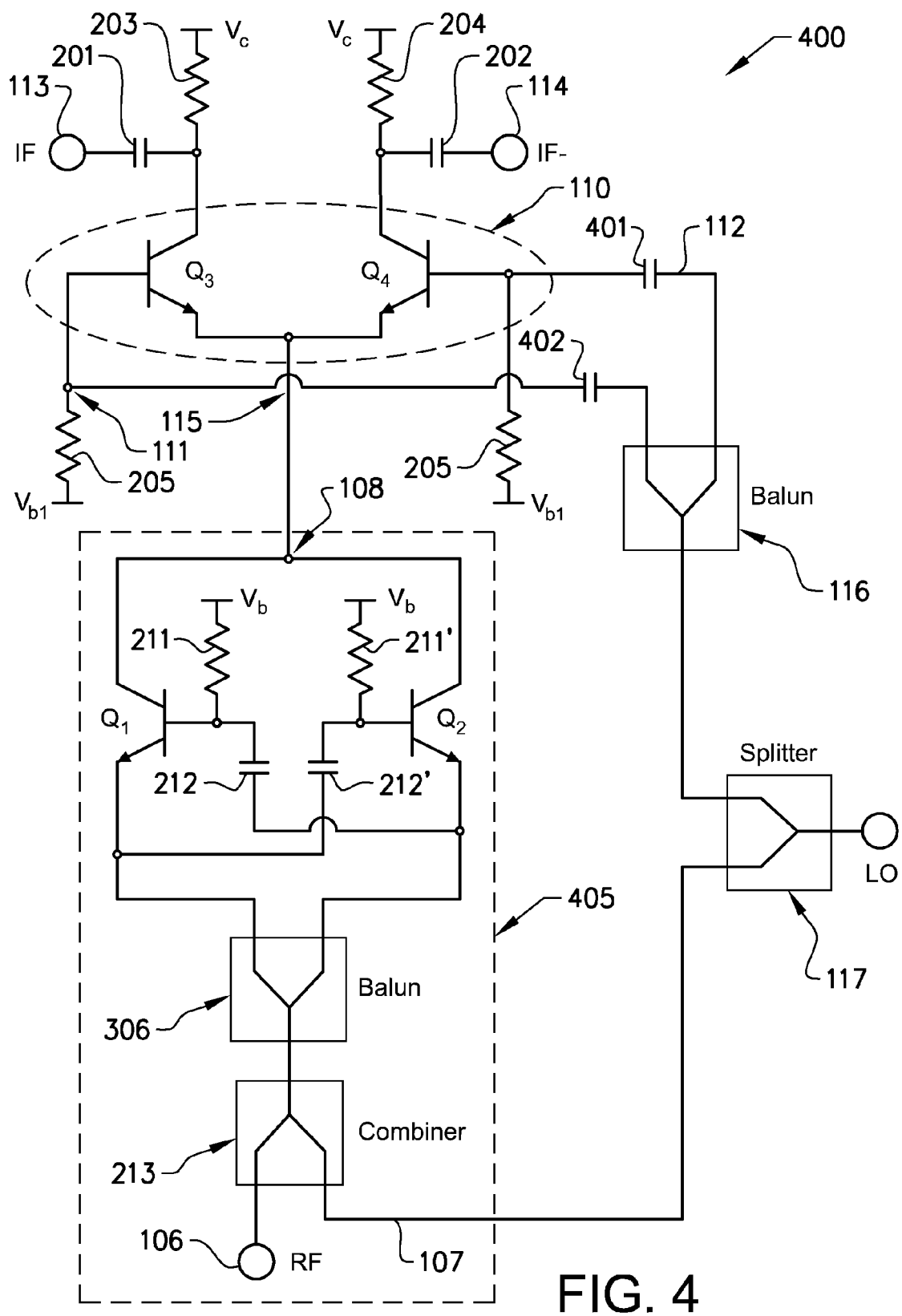

FIG. 4 shows a further embodiment 400 of a subharmonic mixer. Only differences between the embodiments 300 and 400 will be described here, in the interest of brevity. As shown in FIG. 4, the bases of the transistors $Q_3$ and $Q_4$ are connected to the respective outputs of "the balanced side" of the balun 116 by means of suitably equally sized capacitors 401, 402.

In addition, in the trans-conductance mixer 405 of the embodiment 400, the emitters and the bases of the transistors $Q_1$ and $Q_2$ are connected to the outputs of "the balanced side" of the balun 306 as follows: the base of one of the transistors $Q_1$, $Q_2$, is connected to the same output of the balun as the emitter of the other transistor $Q_1$, $Q_2$. In this manner, for each transistor $Q_1$, Q2, the RF and LO signals which are applied at the inputs 106, 107, are added differentially at the base and emitter of each transistor, so that each transistor's base-emitter AC voltage $V_{BE}$ can be expressed as $(V_{LO}+V_{RF})-(-V_{LO}-V_{RF})=2(V_{LO}+V_{RF})$, where $V_{LO}$ is the voltage level of the LO signal and $V_{RF}$ is the voltage level of the RF signal. At the same time, the (AC) voltages over the transistors' base-emitter, $V_{BE}$, are in 180 degree anti-phase to each other. In the embodiment 300 of FIG. 3, the corresponding $V_{BE}$ can be shown to be $(V_{LO}+V_{RF})$. Thus, the embodiment 400 of FIG. 4 has double the "voltage swing" of the embodiment 300 of FIG. 3, which gives it a higher conversion gain and a higher LO power efficiency as compared to the embodiment of FIG. 3. The balun 306 also provides DC paths to ground for the balanced ports of the balun, a solution which is used in e.g. so called Marchand baluns.

An advantage which is gained by utilizing a trans-conductance mixer such as the one 105, 305, 405, is that the linearity of the sub-harmonic mixer as such is improved, since transconductance mixers such as those 105, 305, 405, are highly linear in terms of the so called third order intercept point, "IP3" which is used to measure the strength of the third order intermodulation component, with a high IP3 indicating a low third order intermodulation component. (In a similar manner, the parameter IP2 is used to measure the second order intermodulation component, with a high IP2 indicating a low second order intermodulation component.) In addition, those skilled in the field will know that the impact of an LO switching stage on the third intermodulation product is low, which means that a third intermodulation product with a low amplitude from the trans-conductance mixer will remain largely unaffected in the rest of the sub-harmonic mixer. A parameter which is often used to illustrate the level of the third order intermodulation component is the so called "IP3", "the third order intercept point". It should be stressed that a high IP3 indicates a low the third order intermodulation component, which is also the case for the second order intermodulation component, expressed by the parameter IP2.

Figure 5:
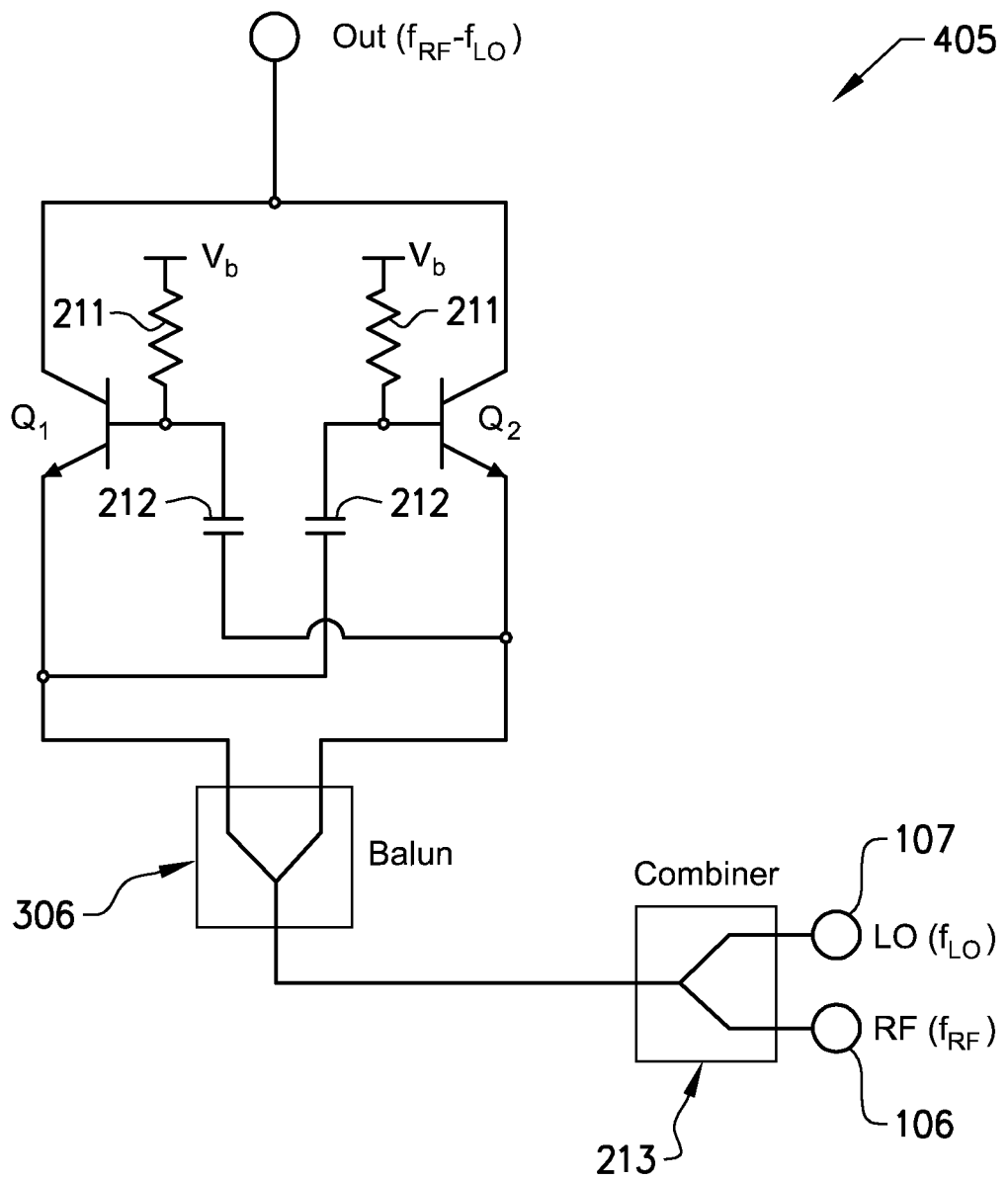
FIG. 5 shows an embodiment of a trans-conductance mixer.
Figure 6:
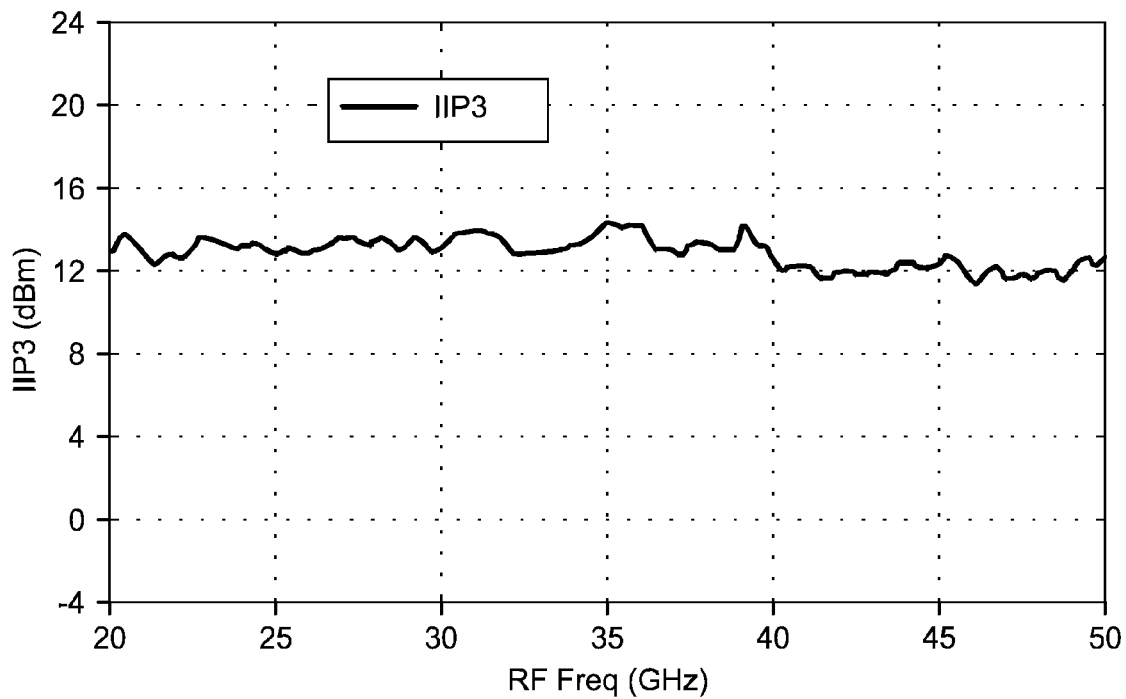
FIGS. 6 and 7 show performance charts of the trans-conductance mixer of FIG. 4.

In order to illustrate the level of the third intermodulation product from the trans-conductance mixer 405 of FIG. 4, which is also shown in FIG. 5, FIG. 6 shows the IP3 of the trans-conductance mixer 405 when a two tone input RF signal (i.e. two RF signals with a frequency separation of, in this case, about 1 MHz) is applied together with an LO signal, and the two tone input RF signal is "swept" in frequency together with the LO signal, so that the output IF signal is kept constant at approximately 2 GHz. It should be pointed out that the "IP3 characteristics" shown in FIG. 6 are basically similar at higher IF frequencies, such as, for example, 20 GHz.

As can be seen in FIG. 6, the IP3 level is constant at approximately 12 dBm over a large range of input RF frequencies.

The trans-conductance mixers 105, 305, 405, operate as a fundamental mixers, i.e. an input RF signal with frequency $f_{RF}$ is mixed with the LO's fundamental frequency component $f_{LO}$, and the resulting IF frequency, $f_{IF}$, can be expressed as $f_{IF}=f_{RF}-f_{LO}$, which means that the trans-conductance mixers 105, 305 have a positive conversion gain (which by way of simulation has been shown to be between 0 and 2 dB), which results in an obtained subharmonic mixer overall which has a moderate conversion gain. Consequently, as can be seen in FIG. 6, the subharmonic mixers 100, 300, 400 have a conversion gain around zero with an IP3 in excess of 12 dBm.

Figure 7:
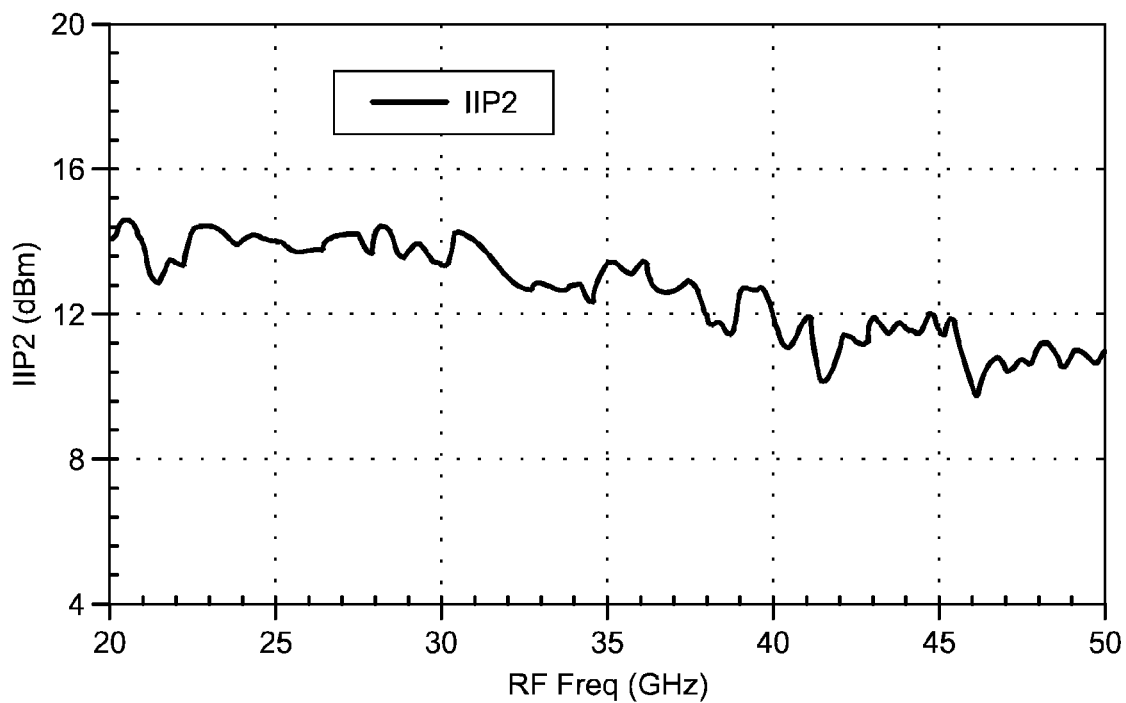

Regarding the second order intermodulation component in the output signal of a trans-conductance mixer such as the one 105, 305 or 405, it can be said that such a trans-conductance mixer may exhibit a high second order intermodulation component, as expressed by a low IP2, i.e. "the second order intercept point", which is used to measure the second order intermodulation component. For instance, as shown in FIG. 7, the measured (input referred) IP2 for the transconductance mixer 405 is lower than 15 dBm. However, the second order intermodulation component produced by the transconductance mixer is a low frequency one which the LO switching stage will up-convert to a frequency around that of the LO signal.

In conclusion, the subharmonic mixer disclosed herein can achieve an IIP2 in excess of 30 dBm.

Figure 8:
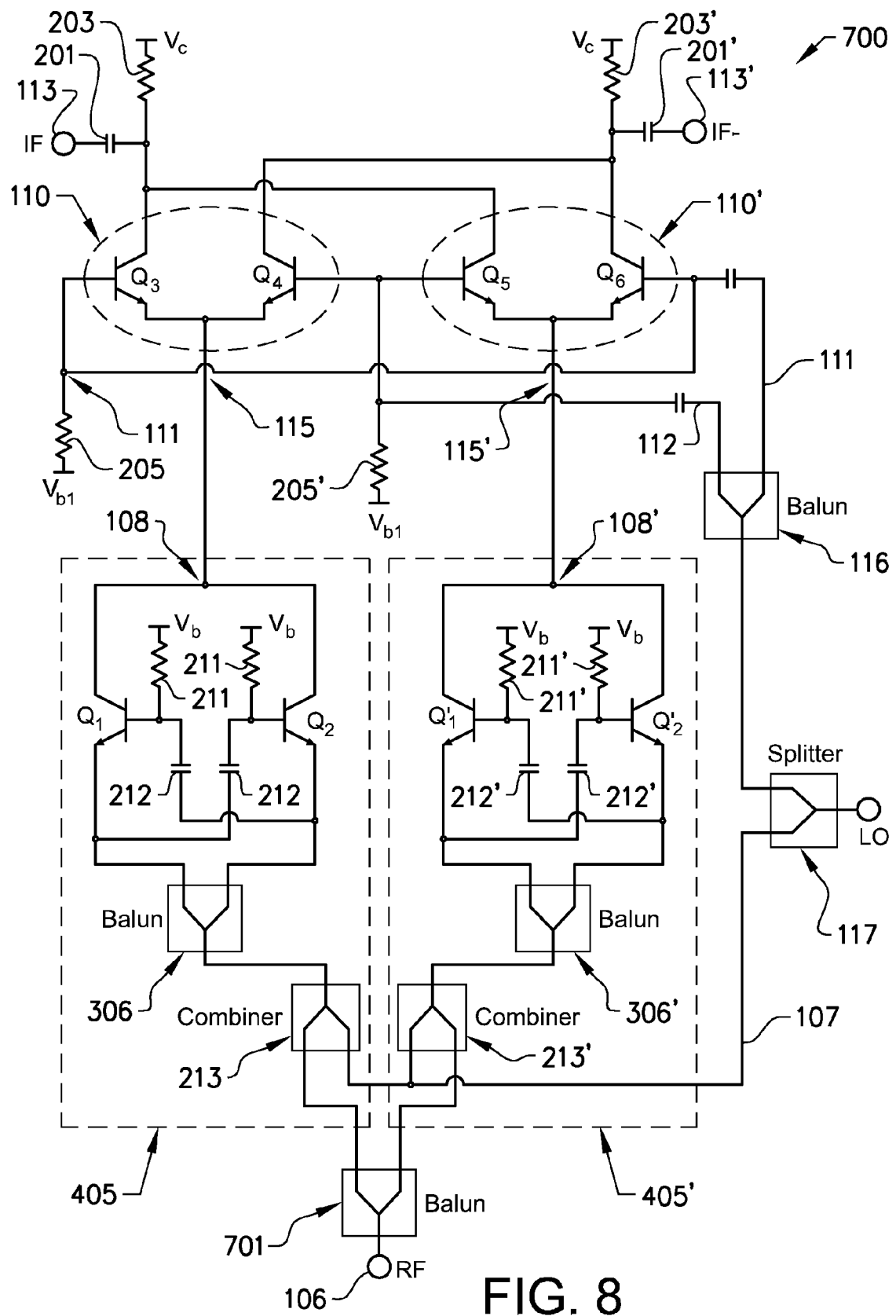
FIG. 8 shows a further embodiment of a subharmonic mixer.

FIG. 8 shows a further embodiment 700 of a subharmonic mixer with improved characteristics as compared to those previously shown in this document with respect to parameters such as e.g. linearity and isolation between LO and RF signals as well as between LO and IF signals and between RF and IF ports.

As shown in FIG. 8, the embodiment 700 basically comprises two subharmonic mixers of the kind shown in FIG. 4. Thus, there is a first transconductance mixer 405 connected to a first LO switching stage 110, which make up a first half of the subharmonic mixer 700 and a second transconductance mixer 405' connected to a second LO switching stage 110' which make up a second half of the subharmonic mixer 700. Components in the first half of the subharmonic mixer 700 are given the same reference numbers as in FIG. 4, and components in the second half of the subharmonic mixer 700 are given corresponding reference numbers, but with a "prime", e.g. 110 and 110' for the LO switching stage of the first and the second halves of the subharmonic mixer 700.

In addition to the components shown in FIG. 4, the subharmonic mixer 700 also comprises a third balun 701, which is used to input an RF signal to the power combiners 213, 213', as follows: The "unbalanced" side of the balun 701 is used as an input port for the RF signal, and the two ports at the "balanced" side are used as inputs to one each of the power combiners 213, 213'. The LO signal is input to the power combiners 213, 213' by means of the power splitter 117, so that one of the output ports of the power splitter 117 is connected to each of the "LO ports" of the power combiners 213, 213', i.e. the ports which are not used for the RF signal The LO signal is also input to the LO switching stages 110, 110' of the two halves of the subharmonic mixer 700 as follows: The output port of the power splitter 117 which is not used for the transconductance mixers 305, 305' is connected to the "unbalanced" side of the balun 116, and the ports at the "balanced" side of the balun 116 are connected, suitably via capacitors, to the transistors $Q_3$, $Q_4$, $Q_5$, $Q_6$ of the LO switching stages as follows: a first output signal with one and the same phase from the balun 116 is connected to the base of a first transistor $Q_3$, $Q_6$, of each LO switching stage, and a second output signal with one and the same phase but 180 degrees shifted from the first output signal from the balun 116 is connected to the base of a second transistor $Q_4$, $Q_5$, of each LO switching stage.

The output signals IF and IF− (i.e. IF signals shifted 180 degrees relative to each other) are accessed in the subharmonic mixer as follows: one of the IF signals, in this case denoted as IF, is accessed from the (connected) collectors of the first transistor $Q_3$ of the first LO switching stage 110 and the second transistor $Q_5$ of the second LO switching stage 110'. The other of the IF signals, in this case denoted as IF−, is accessed from the (connected) collectors of the second transistor $Q_4$ of the first LO switching stage 110 and the first transistor $Q_6$ of the second LO switching stage 110'.

Both of the IF signals, i.e. both IF and IF− are suitably accessed via capacitors 201,201', suitably equally sized.

Bias signals are applied to the two halves of the subharmonic mixer 700 in the same manner as shown in FIG. 4.

Throughout in the drawings and in the description, bipolar junction transistors have been used. In other embodiments, FET-transistors are used instead, and the couplings are then replaced as follows: the bases of the bipolar junction transistors are replaced by the gates of the FET-transistors, the collectors of the bipolar junction transistors are replaced by the drains of the FET-transistors and the emitters of the bipolar junction transistors are replaced by the sources of the FET-transistors.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A sub-harmonic mixer comprising:
    a mixer circuit with an input port for an RF signal and an input port for an LO signal;
    an output port at which the mixer circuit is arranged to output a signal which is the product of the signals at the mixer circuit's input ports; and
    an LO switching stage with a first input port for the LO signal and a second input port for the LO signal phase shifted 180 degrees with respect to its phase at the first input port, wherein the LO switching stage further comprises:
        a third input port to which the output port of the mixer circuit is connected; and
        a first output port at which the LO switching stage is arranged to output a first output signal which is the product of the signal at its third and first input ports, and a second output port at which the LO switching stage is arranged to output a second output signal which is the product of the signal at its third and second input port and which has the same amplitude as the first output signal but with a 180 phase difference,
    and wherein the mixer circuit comprises a transconductance mixer which in turn comprises a power combiner with two input ports and one output port, with one of the two input ports used as the input port for an RF signal and the other as the input port for the LO signal, and the output port connected to the base/gate of a bipolar/FET transistor which is also comprised in the transconductance mixer, with the collector/drain of the bipolar/FET transistor being used as the output port of the transconductance mixer, with the emitter/source of the bipolar/FET transistor being grounded.

2. The sub-harmonic mixer of claim 1, further comprising a power splitter for splitting an LO signal into first and second LO signals, where the first LO signal is connected to the input port for an LO signal of the transconductance mixer and the second LO signal is used to produce the LO signals for the first and second input ports of the LO switching stage.

3. The sub-harmonic mixer of claim 2, further comprising a first balun which is used with the second LO signal in order to produce the LO signals for the first and second input ports of the LO switching stage.

4. The sub-harmonic mixer of claim 1, in which the LO switching stage further comprises an emitter/source coupled pair of bipolar/FET transistors, with the emitter/source coupling used as the third input port of the LO switching stage, and the bases/gates of the transistors as the first and second input ports and the collectors/drains as the first and second output ports.

* * * * *